United States Patent [19]

Shinohara

[11] Patent Number: 5,194,118
[45] Date of Patent: Mar. 16, 1993

[54] DRY ETCHING METHOD
[75] Inventor: Keiji Shinohara, Kanagawa, Japan
[73] Assignee: Sony Corporation, Tokyo, Japan
[21] Appl. No.: 816,383
[22] Filed: Dec. 27, 1991
[30] Foreign Application Priority Data
Dec. 28, 1990 [JP] Japan .................. 2-416336
[51] Int. Cl.$^5$ ........................................... H01L 21/00
[52] U.S. Cl. .................... 156/643; 156/646;
156/659.1; 156/664; 148/DIG. 106
[58] Field of Search ..................... 156/659.1, 646, 662,
156/664, 643

[56] References Cited
U.S. PATENT DOCUMENTS

| | | | |
|---|---|---|---|
| 3,773,578 | 11/1973 | Glendinning et al. | 156/662 |
| 4,028,155 | 6/1977 | Jacob | 252/79.1 |
| 4,207,105 | 6/1980 | Sato | 156/659.1 |
| 4,229,247 | 10/1980 | Chin et al. | 156/646 |
| 4,292,384 | 9/1981 | Straughan et al. | 156/643 |
| 4,529,860 | 7/1985 | Robb | 156/643 |
| 4,956,043 | 9/1990 | Kanetomo et al. | 204/298.31 |
| 5,057,187 | 10/1991 | Shinagawa et al. | 156/668 |

FOREIGN PATENT DOCUMENTS 63-128630 6/1988 Japan .

Primary Examiner—Brian E. Hearn
Assistant Examiner—George Goudreau
Attorney, Agent, or Firm—Hill, Steadman & Simpson

[57] ABSTRACT

A method for dry etching enabling good anisotropic processing even at a wafer cooling temperature closer to room temperature than with conventional low temperature etching. Etching is carried out using an etching gas including a compound containing oxygen (O) as a component element and a compound containing hydrogen (H) as a component element, or using a $H_2O$ containing gas, while the wafer is cooled to a temperature not higher than 0° C. $H_2O$ produced or present in an etching system is condensed in a quantity monistically determined by the relation between the amount of the moisture and the dew point and is deposited as ice on a wafer surface. This ice contributes to anisotropic processing by being deposited on a pattern sidewall on which ions are not bombarded in the perpendicular direction. In this manner, etching at a temperature at which ice can be deposited is enabled without regard to the combinations between the layer of a material to be etched and the etching gas. Selectivity may also be improved because the amount of the ion incident energy may be reduced in expectation of the sidewall protection effects of ice. There is no risk of particle contamination because ice may be removed by wafer heating and evacuation to vacuum.

6 Claims, 2 Drawing Sheets

DRY ETCHING METHOD

BACKGROUND OF THE INVENTION

1. Field of the Invention

This invention relates to a dry etching method used in the preparation of semiconductor devices. More particularly, it relates to raising the wafer cooling temperature in so-called low temperature etching and to improving selectivity with respect to the underlying layer and to the mask.

2. Description of the Related Art

With the tendency in recent years towards a higher integration degree and higher performance of semiconductor devices, such as VLSIs or ULSIs, a strong demand has been raised for a technique in the field of dry etching whereby requirements for high anisotropy, high etchrate and high selectivity may be achieved simultaneously.

A so-called low-temperature etching, in which etching is performed while the wafer temperature is controlled during etching so as to be not higher than 0° C., is one of the techniques which has attracted attention under such a background. The low-temperature etching is a technique in which a radical reaction on the pattern sidewall is "frozen" or suppressed to prevent profile defects such as undercuts, while the etchrate along the depth is maintained by the ion assist effects by maintaining the wafer at lower temperatures. For example, in a lecture paper number 28a-G-2, page 495, Lecture Papers, in Extended Abstracts of the 35th Spring Meeting of the Japan Society of Applied Physics and related Societies, a report has been made on silicon trench etching and etching of a n+ type polysilicon layer, in which etching was performed using an $SF_6$ gas while the wafer was cooled to $-130°$ C.

However, a number of problems remain to be solved in the low-temperature etching if it is to be applied in practice. One of these problems is the wafer cooling temperature. If high anisotropy is to be achieved by "freezing" (termination) or suppression of the radical reaction, a low temperature is required which may be achieved by liquid nitrogen. Thus, cooling to $-120°$ to $-130°$ C. is used for single crystal silicon or polysilicon, while cooling to $-100°$ C. and cooling to about $-60°$ C. are used for a resist material and tungsten silicide, respectively. The result is that a peripheral cooling equipment of a considerable cooling capacity is required and this equipment increases the size of the apparatus and raises production costs. Although it is known to use reaction products for sidewall protection in the mid to low temperature, there is a risk that, due to the low vapor pressure of reaction products, these tend to be deposited on the pattern sidewall to increase the pattern width. In addition, the cooling time or the time necessary for post-heating for preventing dewing after etching tends to be prolonged to detract from economic profitability or throughput. For these reasons, it has been desired to raise the wafer cooling temperature closer to room temperature.

Another problem is the setting of the wafer temperature for etching a layered structure composed of layers of different materials. Since the reaction between etchant(s) and the material to be etched is partially suppressed in the low-temperature etching, the temperature at which high anisotropy is achieved is delicately changed depending on different combinations of the etching gas and the etched material. Thus, although a single temperature setting suffices for a material composed of a single layer, satisfactory anisotropic processing is difficult to achieve by a single temperature setting in the case of, for example, a polycide layer composed of superimposed tungsten silicide and doped polysilicon layers, because the optimum temperatures for low-temperature etching of these two layers differ by as much as about 60° C. Although a multi-chamber etching equipment would be required for stably setting plural temperatures, this is not desirable in view of the space occupied by the equipment and increased running costs and costs for maintaining a clean zone in a clean room.

OBJECT AND SUMMARY OF THE INVENTION

It is an object of the present invention to provide a method for dry etching which enables the wafer cooling temperature for low-temperature etching to approach closer to room temperature than heretofore and which allows etching of a layered structure composed of layers of different materials with a single temperature setting.

The present inventor has departed from the conventional concept of achieving high anisoropy by freezing or suppression of the radical reaction, and attempted to use a wafer cooling temperature higher than that used heretofore and to positively add a gas capable of yielding a deposition material from a gaseous phase to an etching gas system, or to make use of an etching gas system capable of heaping a reaction product with a layer of an etched material.

It is ice ($H_2O$) to which the present inventor directed attention as a candidate for the deposition material. Ice has a known dew point and moisture such that measured data for ice is available, such as the moisture of 77 ppm for the dew point of $-20°$ C. or the moisture of 21 ppm for the dew point of $-40°$ C. The dew point is the temperature at which the partial pressure of water vapor in the etching system becomes equal to the saturated water vapor pressure. If the moisture in an amount of X ppm, where $X>77$, is present in the etching system when the wafer is cooled to, for example, $-20°$ C., the moisture in an amount of $(X-77)$ ppm is supersaturated in the close vicinity of the wafer, so as to be condensed as ice on the surface of the wafer or the surface of other cooled objects. Although the ice is sputteringly removed on a surface lying orthogonally to incident ions, it is not removed on the pattern sidewall, so that it functions as a sidewall protection film to contribute to completion of the anisotropic profile.

Thus, in accordance with the present invention, it becomes necessary to cause water to be present in some form within an etching system. To this end, a gas mixture of a compound containing O as a component element and a compound containing H as a component element is used to produce $H_2O$ in a plasma, or alternatively, an etching gas containing $H_2O$ is used. In any case, in accordance with the present invention, there is no necessity of cooling the wafer to a temperature of freezing or suppressing the radical reaction, and anisotropic processing may be performed at an ice forming temperature without regard to the types or combinations of the etching gas and etched materials. In this manner, the wafer cooling temperature may approach closer to room temperature than in conventional low-temperature etching.

In addition, the deposited ice may be easily vaporized off by heating the wafer only slightly, if under a high vacuum for usual etching, without the risk of inviting particle contamination.

On the other hand, according to the present invention, since anisotropic processing may be achieved with a small amount of incident ion energy sufficient for sputtering removal of ice, underlying layer selectivity may be achieved advantageously.

Besides, since the deposition of reaction products is not utilized with the present invention, ice is naturally deposited on the mask surface in a competitive manner with sputtering removal by incident ions, with a resulting merit that mask selectivity is improved.

It is also noted that the present invention may be applied to any kind of low-temperature etching processes without regard to the type of the etching device.

In this manner, the present invention is highly effective in improving the reliability, economic profitability and productivity of semiconductor devices on the basis of the highly refined design rules.

BRIEF DESCRIPTION OF THE DRAWINGS

FIGS. 1a and 1b are schematic cross-sectional views showing a magnetic microwave plasma etching device employed for practicing the dry etching method of the present invention, wherein FIG. 1a shows the state in which the device is used for low-temperature etching and FIG. 1b shows the state in which the device is used for plasma treatment following the low-temperature etching.

DETAILED DESCRIPTION OF THE INVENTION

Preferred embodiments of the present invention will be explained in detail hereinbelow.

Before proceeding to the description of an actual etching process, a typical construction of the etching device used for practicing the invention, special artifices or manner in using the device and improvements in the cooling systems, will be explained with reference to the drawings. Although the magnetic microwave plasma etching device is explained as the aforementioned etching device, the artifices in using the device and the improvements in the cooling systems may apply to other etching devices used in the present invention, such as parallel flat plate type reactive ion etching (RIE) equipment or magnetron RIE equipment.

Figure 1A:
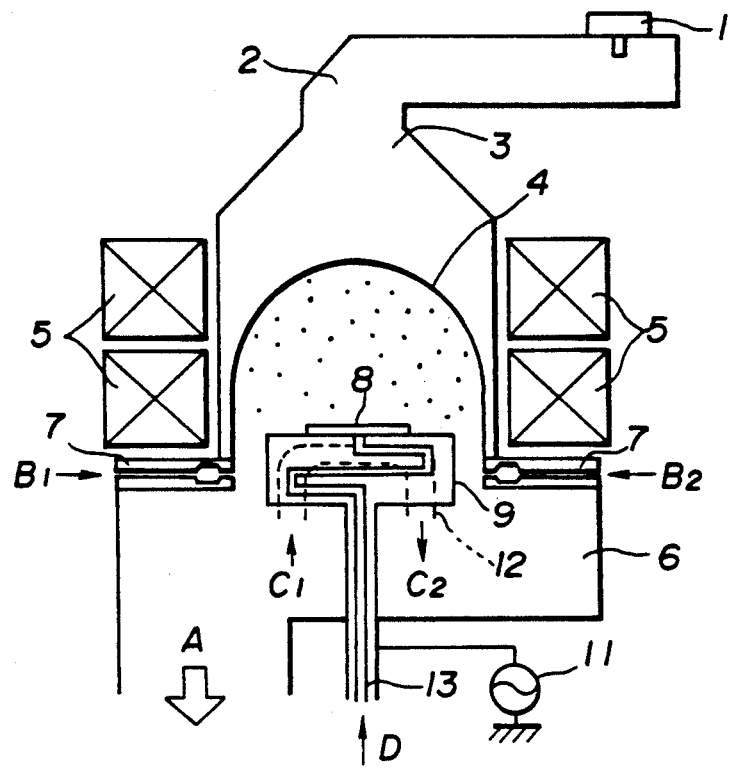
Figure 1B:
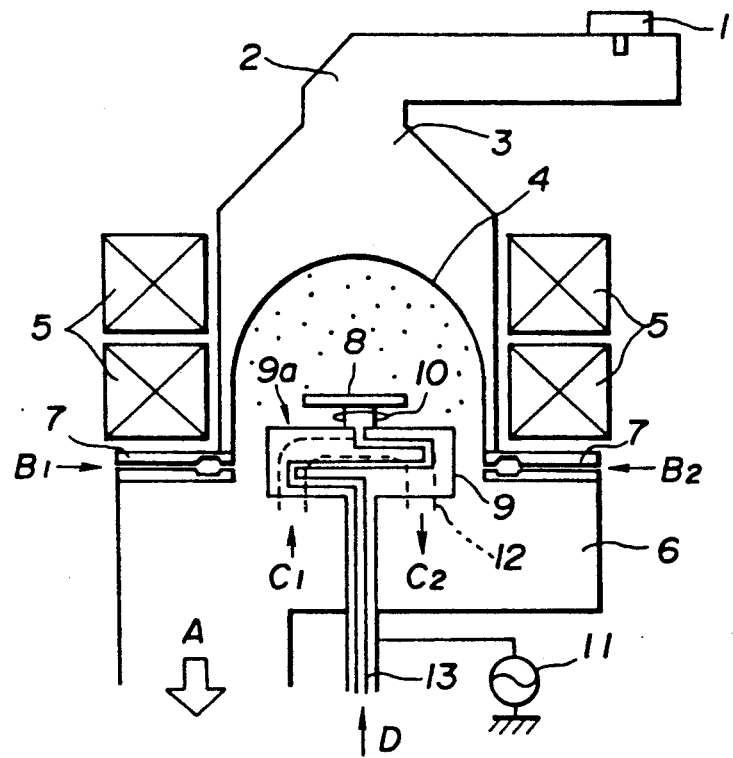

FIGS. 1a and 1b are schematic cross-sectional views showing a typical construction of the above etching device. The etching device is adapted for performing a variety of processing operations using a high-density plasma generated by electron cyclotron resonance (ECR), and is basically made up of a magnetron 1 for producing microwaves of 2.45 GHz, a rectangular waveguide 2 and a circular waveguide 3 for guiding the microwaves, a quartz bell jar 4 for generating the plasma by ECR discharge by microwaves, a solenoid coil 5 mounted for surrounding the circular waveguide 3 and the bell jar 4 and adapted for achieving a magnetic field intensity of 875 Gauss, a reaction chamber 6 connected to the bell jar 4 and adapted for evacuating the bell jar in the direction shown by arrow A to high vacuum, an gas inlet pipe 7 for supplying a necessary processing gas into the reaction chamber 6 and the bell jar 4 from the direction shown by arrows $B_1$ and $B_2$, a wafer setting electrode 9 for setting a wafer 8 as an etched object thereon, and an RF power source 11 for applying an RF bias to the wafer setting electrode 9. For enabling low-temperature etching by the above device, a cooling conduit 12 for introducing a cooling medium to the wafer setting electrode 9 from a cooling equipment provided out of the device for circulation in the directions shown by arrows $C_1$ and $C_2$ in FIG. 1 is embedded within the wafer setting electrode 9.

The artifice or manner in using the apparatus is that, after a predetermined operation has been performed within the bell jar 4, the wafer 8 is uplifted by pins 10, as shown in FIG. 1b, for thermally isolating the wafer 8 from the cooling of the wafer setting electrode 9, and plasma processing is carried out in this state by supplying a chemically stable gas. In low-temperature etching in which a predetermined treatment is carried out while the wafer 8 is cooled to 0° C. or lower, one of the crucial technical tasks is to prevent dewing when the processed wafer 8 is taken out into atmosphere. Although it has been proposed to provide a separate stage for wafer heating or to blow a gas heated to an elevated temperature on the wafer, the heating and blowing system could not be readily built into the existing etching device. The above artifice resides simply in effectively utilizing the pins 10 provided for assisting in the loading and unloading of the wafer 8. By displacing the wafer 8 from the wafer setting electrode 9, the wafer 8 can be heated easily by the heat of plasma radiation, so that the wafer may be taken out when the wafer has been heated to close to room temperature. Since the temperature of the wafer setting electrode 9 is raised slightly at this time, the material is not deposited in excess quantity on a wafer contacting surface 9a, while the ice deposited on the surface of the wafer setting electrode 9 may be removed simultaneously.

Meanwhile, since the wafer temperature represents a crucial parameter in influencing the process of the low-temperature etching reaction, a more accurate temperature control becomes necessary to perform the process than in ordinary etching not accompanied by wafer cooling. The wafer 8 is usually mounted in pressure contact with the wafer setting electrode 9 using a clamp or the like. For supplementing the cooling effect, a cooling gas pipe 13 for introducing a cooling gas into the inside of the wafer setting electrode 8 is embedded within the interior of the wafer setting electrode 9. The end of the cooling gas pipe 13 is opened into the rear surface of the wafer 8 so that the cooling gas introduced as shown by an arrow D in FIG. 1 from a gas supply source, not shown, and is blown out at the rear surface of the wafer setting electrode. In a conventional system, the cooling gas pipe 13 simply traverses the electrode 9 substantially linearly so that the length of the pipe is short and the cooling gas introduced at room temperature is allowed to flow out before reaching an equilibrium with the electrode temperature without producing sufficient cooling effects. In the present etching device, the cooling gas pipe 13 is formed as a serpentine conduit for elongating the length of the pipe within the electrode 9 for increasing the contact surface between the pipe wall and the wafer setting electrode 9.

Figure 2:
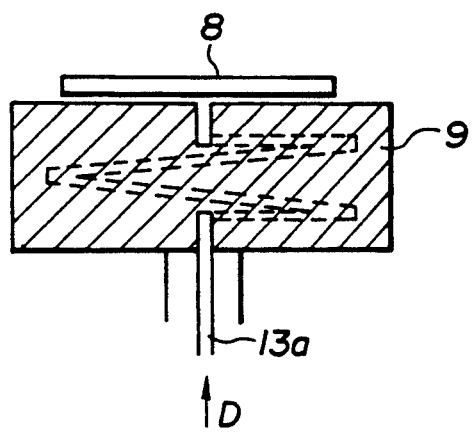
FIG. 2 is a schematic cross-sectional view showing a modification of a wafer-setting electrode used in the etching device shown in FIG. 1.
Figure 3:
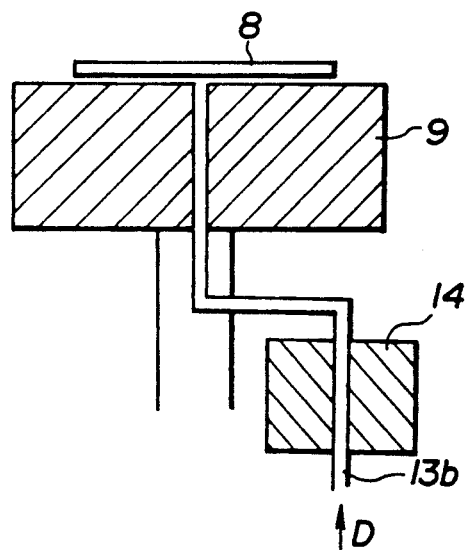
FIG. 3 is a schematic cross-sectional view showing another modification of a wafer-setting electrode used in the etching device shown in FIG. 1.

Alternatively, the cooling gas pipe 13a may be designed helically, as shown in FIG. 2. If the pipe length can not be extended due to the constraint imposed by the inner structure of the wafer setting electrode 9, the cooling gas pipe 13b may be linear, which is conventional, as shown in FIG. 3, and a heat exchanger 14 may be provided at a suitable position on a conduit extending from the cooling gas supply source to the wafer setting electrode 9.

DESCRIPTION OF PREFERRED EMBODIMENTS

The present invention will be explained with reference to several processing examples.

EXAMPLE 1

In the present example, resist pattern processing was carried out using a mixed gas of $O_2$ and $H_2$.

As a sample to be etched, a novolac-based positive type photoresist, manufactured by TOKYO OHKA KOGYO KK under the trade name of OFPR-800, was applied on a silicon substrate to form a resist layer. A silicon oxide mask patterned to a predetermined shape was formed thereon to produce a wafer which was then placed on the wafer setting electrode 9 of a magnetic microwave plasma etching apparatus which is in the state as shown in FIG. 1a. An ethanol cooling medium was circulated from an external chiller through the cooling conduit 12 for maintaining the temperature of $-40°$ C. in the wafer 8 being etched. As a cooling gas, He was supplied from a cooling gas pipe 13 at a flow rate of 10 SCCM. Etching of the resist layer was carried out under conditions of the $O_2$ gas flow rate of 50 SCCM, the $H_2$ gas flow rate of 1 SCCM, a gas pressure of 1.3 Pa (10 mTorr), a microwave power of 850 W and an RF bias power of 10 W (13.56 MHz).

During the present process, a quantity exceeding 21 ppm of $H_2O$ generated in a gaseous phase by plasma discharge in close proximity of the wafer 8 was condensed as ice on the surface of cooled members in the etching device inclusive of the wafer 8. The ice deposited on the surfaces bombarded by the ions such as $O^+$ or $O_2^+$ was sputteringly removed, so that etching of the resist layer was allowed to proceed, while the ice played the role of sidewall protection against attack by radicals on the pattern sidewall bombarded by a lesser amount of ions. In this manner, anisotropic processing was achieved without lowering the etchrate.

It is to be noted that, for condensing the ice efficiently on the wafer 8, it is only sufficient to diminish the quantity of members or parts beside the wafer setting electrode 9 which parts are cooled to the low temperature.

During this process, an ion incident energy only sufficient for sputtering removal of the ice on the ion incident surfaces is necessitated, so that the above mentioned low RF bias power is sufficient. In this manner, sputtering or injuries to the underlying layer could be suppressed during overetching.

After the end of etching, the wafer 8 was raised by the pins 10, as shown in FIG. 1b, and plasma treatment was performed for 10 seconds under conditions of an Ar gas flow rate of 100 SCCM, a gas pressure of 2.7 Pa (20 mTorr), a microwave power of 850 W and an RF power of 0 W. In this manner, the wafer 8 was heated quickly to close to room temperature and no dewing was produced on its surface when it was taken out into the atmosphere. According to the present invention, since the cooling temperature of the wafer 8 was closer to room temperature than in the case of conventional low-temperature etching, heating could be completed in a shorter time without lowering the throughput. On the other hand, while the cooling medium was circulated through the inside of the wafer setting electrode 9, the electrode was heated slightly by the heat radiated from the plasma, so that the ice formed on the electrode surface could be removed.

The plasma treatment is performed in the following examples in the same manner as described above, although no reference of plasma treatment is made therein for simplicity.

EXAMPLE 2

In the present example, processing of a resist layer was performed using a gas mixture containing $O_2$ with a minor quantity of $H_2O$.

A wafer similar to that of example 1 was set on a wafer setting electrode 9 of the magnetic microwave plasma etching device in the state shown in FIG. 1a and the resist layer was etched under conditions of the wafer cooling temperature of $-40°$ C., an $O_2$ gas flow rate of 50 SCCM, an addition amount of $H_2O$ of 100 ppm, a gas pressure of 1.3 Pa (10 mTorr), a microwave power of 850 W and an RF bias power of 10 W (13.56 MHz). Since it was practically difficult to control the flow rate of the trace amount of $H_2O$ independently, it was previously added as impurities into $O_2$.

During this etching process, about 80 ppm of $H_2O$ was supersaturated in the vicinity of the wafer 8 and turned into ice to display the effects of sidewall protection to achieve good anisotropic profile.

It is noted that the amount of addition of $H_2O$ may be suitably set with 1 ppm as an upper limit and a quantity of saturated moisture at the cooling temperature of the wafer as a lower limit. If the lower limit is lower than 1 ppm, it becomes necessary to cool the wafer to an ultra low temperature which is not in keeping with the present invention's purpose which is aimed at a low-temperature etching at a temperature close to room temperature.

EXAMPLE 3

In the present example, a doped polysilicon layer was processed using a gas mixture of $SF_6$ and a trace amount of $H_2O$ by way of performing simulated gate processing.

A gate oxide film of silicon oxide and an $n^+$ type doped polysilicon layer were formed on a silicon substrate, and a photoresist mask was patterned thereon to a predetermined shape. A wafer thus produced was placed on a wafer setting electrode 9 of a magnetic microwave plasma etching device which was in the state shown in FIG. 1a. The doped polysilicon layer was etched under conditions of the wafer cooling temperature of $-40°$ C., an $SF_6$ flow rate of 50 SCCM, an addition amount of $H_2O$ of 100 ppm, a gas pressure of 1.3 Pa (10 mTorr), a microwave power of 850 W and an RF bias power of 30 W (13.56 MHz). Similarly to example 2, $H_2O$ was supplied as it was previously mixed into $SF_6$.

With this etching process, about 80 ppm of $H_2O$ was supersaturated. However, the etching of the doped polysilicon was allowed to proceed because the ice condensed on the surfaces bombarded by ions such as $SF_x^+$, $O^+$ or $O_2^+$ were sputteringly removed. Although the radical reaction was not suppressed at the cooling temperature of an order of $-40°$ C., undercuts were not produced by fluorine radicals ($F^*$) because the pattern sidewall was protected by the ice. On the other hand, although an oxide film was formed with the present reaction system on the surface to be etched by $O_2$ produced by discharge decomposition, this oxide film was readily removed by F* exhibiting high reactivity with respect to the oxide film, so that a problem such as a lowered etchrate was not produced. By the above etching, anisotropic processing of the doped polysilicon, which heretofore necessitated a temperature as low as $-120°$ to $-130°$ C., could be achieved at $-40°$ C.

EXAMPLE 4

In the present example, silicon trench etching was carried out using a gas mixture of $SF_6$ with a trace amount of $H_2O$.

A silicon oxide mask patterned to a predetermined profile was formed on a silicon substrate to produce a wafer which was then set on a wafer-setting electrode of a parallel flat plate type reactive ion etching (RIE) device. The silicon substrate was etched under conditions of a wafer cooling temperature of $-40°$ C., an $SF_6$ flow rate of 50 SCCM, an addition amount of $H_2O$ of 100 ppm, a gas pressure of 8 Pa (60 mTorr) and an RF power density of 0.3 $W/cm^2$ (13.56 MHz).

The etching mechanism was substantially the same as that of example 3, and a trench exhibiting a good anisotropic profile was formed.

EXAMPLE 5

In the present example, a polycide film assumed to be a gate was processed using a gas mixture composed of $SF_6$, HBr and a minor amount of $H_2O$.

A polycide film consisting of an $n^+$ type doped polysilicon layer and a tungsten silicide layer, referred to hereinafter as a $WSi_x$ layer, were sequentially stacked on a silicon substrate with a silicon oxide gate oxide film in-between, and a photoresist mask patterned to a predetermined shape was formed on the polycide film, to provide a wafer. This wafer was set on a wafer-setting electrode 9 of a magnetic microwave plasma etching device which was in the state shown in FIG. 1a. The polycide film was etched under conditions of the wafer cooling temperature of $-40°$ C., an $SF_6$ gas flow rate of 30 SCCM, an HBr gas flow rate of 20 SCCM, an addition amount of $H_2O$ of 100 ppm, a gas pressure of 1.3 Pa (10 mTorr), a microwave power of 850 W and an RF bias power of 10 W (13.56 MHz). Similarly to example 2, $H_2O$ was supplied as it was previously mixed into $SF_6$.

During this etching process, about 80 ppm of $H_2O$ was supersaturated, however, etching of the polycide film was allowed to proceed because the condensed ice was sputteringly removed on those surfaces bombarded by the ions such as $SF_x^+$, $Br^+$, $Br_2^+$, $O^+$ or $O_2^+$. On the other hand, no undercuts were produced by the fluorine radicals (F*) because the pattern sidewall was protected by ice.

Up to now, difficulties were presented in dry etching of a polycide film because the optimum etching conditions for one of the stacked materials differed from those for the remaining stacked material. In consideration that undercuts or the like unusual profiles tend to be produced above all in the doped polysilicon layer, various proposals have been made, such as switching the etching conditions at the interface between the $WSi_x$ layer and the doped polysilicon layer. According to the present invention, sidewall protection may be achieved by taking advantage of ice which is condensed at a monistical quantity depending on the relation between the dew point and the quantity of the moisture in the etching system, so that good anisotropic processing may be achieved with a single temperature setting even with etching of a multilayer film consisting of films of different materials stacked together. This represents an important merit of the present invention.

EXAMPLE 6

In the present example, etching was performed of a silicon oxide layer with a gas mixture containing $C_3F_8$ with a trace amount of $H_2O$.

A silicon oxide was formed on a silicon substrate as by CVD and a photoresist mask patterned to a predetermined profile was formed thereon to provide a wafer, which was then set on a wafer setting electrode of a magnetron RIE device. The silicon oxide layer was etched under conditions of the wafer cooling temperature of $-40°$ C., a $C_3F_8$ gas flow rate of 50 SCCM, an amount of addition of $H_2O$ of 100 ppm, a gas pressure of 2 Pa (15 mTorr) and an RF power of 600 W (13.56 MHz).

In a manner slightly different from the effects achieved with the preceding five examples, the effects of the present example reside in the improved resist selectivity rather than the raising of the cooling temperature for anisotropic processing. It is because the etching of the silicon oxide layer is based on the ion assist reaction and there is inherently only little necessity for sidewall protection.

During this etching process, about 80 ppm of $H_2O$ is supersaturated so that ice is deposited on wafer surfaces. The deposited ice is ready to be removed because ion bombardment occurs on the silicon oxide surface to be etched and the wafer temperature is locally raised by the heat of reaction between the etchants and silicon oxide. Conversely, ice tends to be deposited on the photoresist mask surface because the heat of reaction is not evolved and $H_2O$ is also produced by the reaction between hydrogen in the plasma and the photoresist material. The result is the improved resist selectivity. The ice deposited on the pattern sidewall naturally plays the role of sidewall protection in cooperation with the carbon-based polymer.

The present invention is not limited to the preceding six processing examples. The gases used for etching, the etching conditions etc. may be suitably selected or set depending on the types of the etched materials or the etching device employed.

For example, the compounds containing O as a component element may also be NO, $NO_2$, $N_2O$ or $N_2O_3$, besides $O_2$ of example 1.

On the other hand, the compounds containing H as a component element may also be hydrogen halides, such as HCl, HF or HBr, low molecular-weight organic compounds, such as $CH_4$, $C_2H_4$ or $CH_3OH$, or $NH_3$, besides $H_2$ used in example 1.

What is claimed is:

1. A method for dry etching comprising providing a wafer having a layer of material to be etched, maintaining the wafer at a temperature not higher than 0° C., introducing a gas mixture including a compound containing oxygen as a component element and a compound containing H as a component element, with the amount of water vapor being present being greater than the dew point for the temperature of the wafer being etched so as to form ice on side walls of the component and a mask of the component to reduce etching of the side walls and material of the mask.

2. The method as claimed in claim 1 wherein said compound containing O as a component element is at least one compound selected from the group consisting of $O_2$, $NO$, $NO_2$, $N_2O$ and $N_2O_3$.

3. The method as claimed in claim 1 wherein said compound containing H as a component element is at least one compound selected from the group consisting of hydrogen halides, lower hydrocarbons, lower alcohols and $NH_3$.

4. The method as claimed in claim 1 wherein said material is one of an organic resist material, a semiconductor material, a dielectric material and an electrically conductive material.

5. A method for dry etching comprising providing a wafer having a layer of material to be etched, maintaining said wafer at a temperature not higher than 0° C., introducing an etching gas containing $H_2O$ with the amount of $H_2O$ exceeding the dew point for the temperature of said wafer to form ice particles on surfaces of the wafer to inhibit etching of those surfaces which are not desired to be etched.

6. The method as claimed in claim 5 wherein said material is one of an organic resist material, a semiconductor material, a dielectric material and an electrically conductive material.

* * * * *